(12) United States Patent
Beer (10) Patent No.: US 7,468,910 B2
(45) Date of Patent: Dec. 23, 2008

(54) METHOD FOR ACCESSING A MEMORY

(75) Inventor: Peter Beer, Weilheim (DE)

(73) Assignee: Qimonda AG, Munich (DE)

( * ) Notice: Subject to any disclaimer, the term of this patent is extended or adjusted under 35 U.S.C. 154(b) by 0 days.

(21) Appl. No.: 11/766,782

(22) Filed: Jun. 21, 2007

(65) Prior Publication Data

US 2008/0002486 A1    Jan. 3, 2008

(30) Foreign Application Priority Data

Jun. 21, 2006    (DE)    .................. 10 2006 028 483

(51) Int. Cl.
*G11C 16/06* (2006.01)

(52) U.S. Cl. .............. 365/185.09; 365/200; 365/189.07

(58) Field of Classification Search ............ 365/185.09, 365/200, 189.07
See application file for complete search history.

(56) References Cited

U.S. PATENT DOCUMENTS

| 5,388,076 A | 2/1995 | Ihara |
| 6,956,777 B2 * | 10/2005 | Komura et al. .............. 365/200 |
| 7,061,800 B2 * | 6/2006 | Ooishi .................... 365/185.09 |

* cited by examiner

*Primary Examiner*—Huan Hoang
(74) *Attorney, Agent, or Firm*—Patterson & Sheridan, L.L.P.

(57) ABSTRACT

Method and apparatus for accessing a memory, wherein the memory has a cell array having a number of memory cells arranged in cell array elements. A cell array element determined to be defective is deactivate. After the cell array element is deactivated, an address of a cell array element is applied to an activation apparatus of the memory in order to activate the cell array element for a given memory access. The applied address is compared with stored error addresses which are assigned to defective cell array elements. In the event of a match between the applied address and one of the error addresses, a redundant cell array element is activated instead of the cell array element.

12 Claims, 5 Drawing Sheets

METHOD FOR ACCESSING A MEMORY

CROSS-REFERENCE TO RELATED APPLICATIONS

This application claims foreign priority benefits under 35 U.S.C. §119 to co-pending German patent application number DE 10 2006 028 483.6-55, filed 21 Jun. 2006. This related patent application is herein incorporated by reference in its entirety.

BACKGROUND OF THE INVENTION

1. Field of the Invention

The present invention relates to a method for accessing a memory having a cell array having a number of memory cells arranged in cell array elements. The invention furthermore relates to a memory in which such a method is carried out.

2. Description of the Related Art

Dynamic semiconductor memories, in particular DRAM (dynamic random access memory), have a memory cell array in which memory cells are interconnected with one another in matrix-type fashion in the form of rows and columns via word lines and bit lines. In this case, an individual memory cell of the memory cell array comprises a storage capacitor and a memory transistor, an information item (bit) being stored as electrical charge in the storage capacitor. The memory transistor, which is also referred to as selection transistor, serves as a switch in order to read or write an information item in the context of an access to a memory cell.

During a read access, a corresponding row or word line is activated by application of a row address to an activation apparatus of the memory. In this way, the memory transistors of memory cells of the relevant row are turned on, whereby the respective storage capacitors are connected to associated bit lines and the charges of the storage capacitors are thus added to the bit lines. The bit lines, which were precharged to an identical potential before the beginning of a read operation, are usually organized in pairs, in which case, through activation of a word line, a storage capacitor of a memory cell is in each case connected to one of the two lines of a bit line pair. In the case of a charged storage capacitor (logic 1 stored), the potential of a bit line is raised slightly, whereas an empty storage capacitor (logic 0 stored) slightly lowers the potential of a bit line. The second line of a bit line pair retains the respectively precharged potential.

In this way a charge difference arises between the bit lines of a bit line pair, which charge difference is amplified with the aid of a primary sense amplifier and subsequently made available to a secondary sense amplifier via switchable data line pairs. In this case, a plurality of primary sense amplifiers form a group and are connected to a secondary sense amplifier in each case via a switching device. Through application of a column address to a further activation apparatus of the memory, one of the switching devices and hence the relevant column is activated, whereby the datum read out by the respective primary sense amplifier is applied to the secondary sense amplifier. The datum present at the secondary sense amplifier can subsequently be output via corresponding data output lines.

The write operation differs only slightly from the read operation of a memory cell. In a corresponding manner, for the addressing of a memory cell, the relevant row or word line of the memory cell array is activated. The consequence of this is that once again a respective charge difference is brought about between the bit lines of bit line pairs which are connected to the enabled memory cells, said charge difference being amplified by primary sense amplifiers. Through activation of the relevant column, the datum to be written can subsequently be impressed on the selected memory cell with the aid of the secondary sense amplifier and the corresponding primary sense amplifier, in which case the signal to be written is not influenced by the existing weaker signal of the memory cell. The existing weaker signal of the memory cell is overwritten on account of the driver strength of the sense amplifiers used. The signal levels of the further bit line pairs are not influenced by the write operation, but rather are only amplified by the primary sense amplifiers as in the read operation.

Defects relating to individual memory cells or groups of memory cells occur virtually unavoidably in the production of DRAM memories. In order to increase the yield of usable memories after production, usually redundant memory cells are concomitantly processed in the memories in order to replace defective memory cells in the context of a memory access. In general, whole cell array elements, i.e. rows or columns which contain the affected defective memory cells, are directly replaced by redundant cell array elements.

For this purpose, the activation apparatuses provided in a memory are provided with programmable fusible links referred to as fuses. After a memory has been produced, functional tests are carried out on the memory with the aid of a test system in order to determine the addresses of defective cell array elements having defective memory cells. These addresses, referred to hereinafter as error addresses, are programmed into the fuses. So-called laser fuses are usually used, which can be severed in a corresponding laser trimming process with the aid of a laser beam for the purpose of storing the error addresses.

For the purpose of replacing defective memory cells in the context of a memory access, the address applied to an activation apparatus is compared with error addresses stored in the fuses. In the case of a match between the applied address and one of the error addresses, a defective row or a defective column is deactivated with the aid of the activation apparatus and a redundant row or column is activated instead of the relevant defective row or column.

In this context a problem can arise due to the fact that the activation of a cell array element by an activation apparatus in the case of an address applied to the activation apparatus can be carried out more rapidly than the comparison of the applied address with error addresses and deactivation of a defective cell array element. Particularly when a column is activated in the context of a read access, a risk thereby arises that a stored information item will be read out both from a defective column and from a redundant column and transmitted via corresponding data lines to a secondary sense amplifier and thus onto the data bus of the memory, whereby the read-out result is erroneous.

For this reason, the activation of a cell array element by an activation apparatus is delayed for a predetermined time duration starting from application of the corresponding address, in order to avoid access to a defective cell array element. However, a procedure of this type has a longer access time and thus results in an increased latency of the relevant memory.

Therefore, there is a need to provide a faster method for accessing a memory and also a memory having a shorter access time.

SUMMARY OF THE INVENTION

One embodiment of the invention proposes a method for accessing a memory, wherein the memory has a cell array having a number of memory cells arranged in cell array elements. When a memory cell arranged in a cell array element of the memory is accessed, an address of the relevant cell array element is applied to an activation apparatus of the memory in order to activate the relevant cell array element for the memory access. The applied address is compared with error addresses which are stored in the activation apparatus and which are assigned to defective cell array elements with defective memory cells. In the event of a match between the applied address and one of the error addresses, a redundant cell array element is activated instead of the relevant defective cell array element with the aid of the activation apparatus. The method according to this embodiment is distinguished by the fact that the relevant defective cell array element is deactivated prior to the application of the address associated with the relevant defective cell array element to the activation apparatus of the memory.

In contrast to conventional methods in which, in the context of a memory access, a relevant defective cell array element is deactivated only after application of an address to an activation apparatus of the memory and after a match has been ascertained between the applied address and error addresses stored in the activation apparatus, in the case of the method according to the invention the defective cell array element is already deactivated prior to the application of the relevant associated address. In this way there is the possibility of activating an (arbitrary) addressed cell array element directly after application of the associated address to the activation apparatus without delaying the activation of the cell array element for a predetermined time duration, as a result of which it is possible to carry out a memory access with a shorter access time. In one embodiment, the method according to the invention can be applied both to a read operation and to a write operation.

In accordance with one embodiment, all of the defective cell array elements of the cell array of the memory are deactivated prior to a first application of an address associated with a cell array element to the activation apparatus. The risk of accessing a defective cell array element is avoided with high reliability in this way.

In a further preferred embodiment, the cell array has rows and columns in which the memory cells are arranged, wherein a cell array element represents a column of the cell array of the memory. A defective column is deactivated prior to the application of an address associated with the relevant column to the activation apparatus of the memory, in order to avoid the risk—which impairs a read operation, in particular—of accessing a defective column prior to deactivation of the defective column.

In accordance with a further preferred embodiment, when a memory cell arranged in a row and in a column is accessed, the relevant row is activated prior to an activation of a column, wherein a defective column is deactivated when the relevant row is activated. A procedure of this type is used in particular in those cases in which the cell array of the memory is subdivided into a plurality of serial blocks, wherein a plurality of columns of different serial blocks can in each case be activated by a common column select signal generated by the activation apparatus.

In accordance with an alternative preferred embodiment, a defective column is already deactivated when the memory is switched on. Such a procedure is performed in particular in those cases in which, in the case of a memory cell array subdivided into a plurality of serial blocks, columns of different serial blocks are in each case activated individually by column select signals which are generated by the activation apparatus and which are respectively assigned to the individual columns. In accordance with a further preferred embodiment, the cell array has rows and columns in which the memory cells are arranged, wherein a cell array element represents a row of the cell array of the memory. A defective row is deactivated prior to the application of an address associated with the relevant row to the activation apparatus of the memory. The risk of activation of a defective row prior to deactivation of the relevant row is avoided by this means.

In a corresponding manner, in this case a defective row is preferably already deactivated when the memory is switched on.

The invention furthermore proposes a memory in which an embodiment of the above-described method according to the invention is carried out. The memory has a cell array having a number of memory cells arranged in cell array elements, and also an activation apparatus for activating a cell array element for a memory access. When a memory cell arranged in a cell array element of the memory is accessed, an address of the relevant cell array element is applied to the activation apparatus in order to activate the relevant cell array element for the memory access. The applied address is compared with error addresses which are stored in the activation apparatus and which are assigned to defective cell array elements. In the event of a match between the applied address and one of the error addresses, a redundant cell array element is activated instead of the relevant defective cell array element with the aid of the activation apparatus. In the manner according to the invention, the memory is designed to deactivate the relevant defective cell array element prior to the application of the address associated with the relevant cell array element to the activation apparatus.

Since, in the case of the memory according to the invention, a defective cell array element is already deactivated prior to the application of the address associated with the relevant cell array element to the activation apparatus, it is possible to activate an (arbitrary) addressed cell array element directly after application of the address associated with the cell array element to the activation apparatus without delaying the activation of the cell array element. Consequently, the memory according to the invention has a short access time.

BRIEF DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

DETAILED DESCRIPTION OF THE PREFERRED EMBODIMENT

Figure 1:
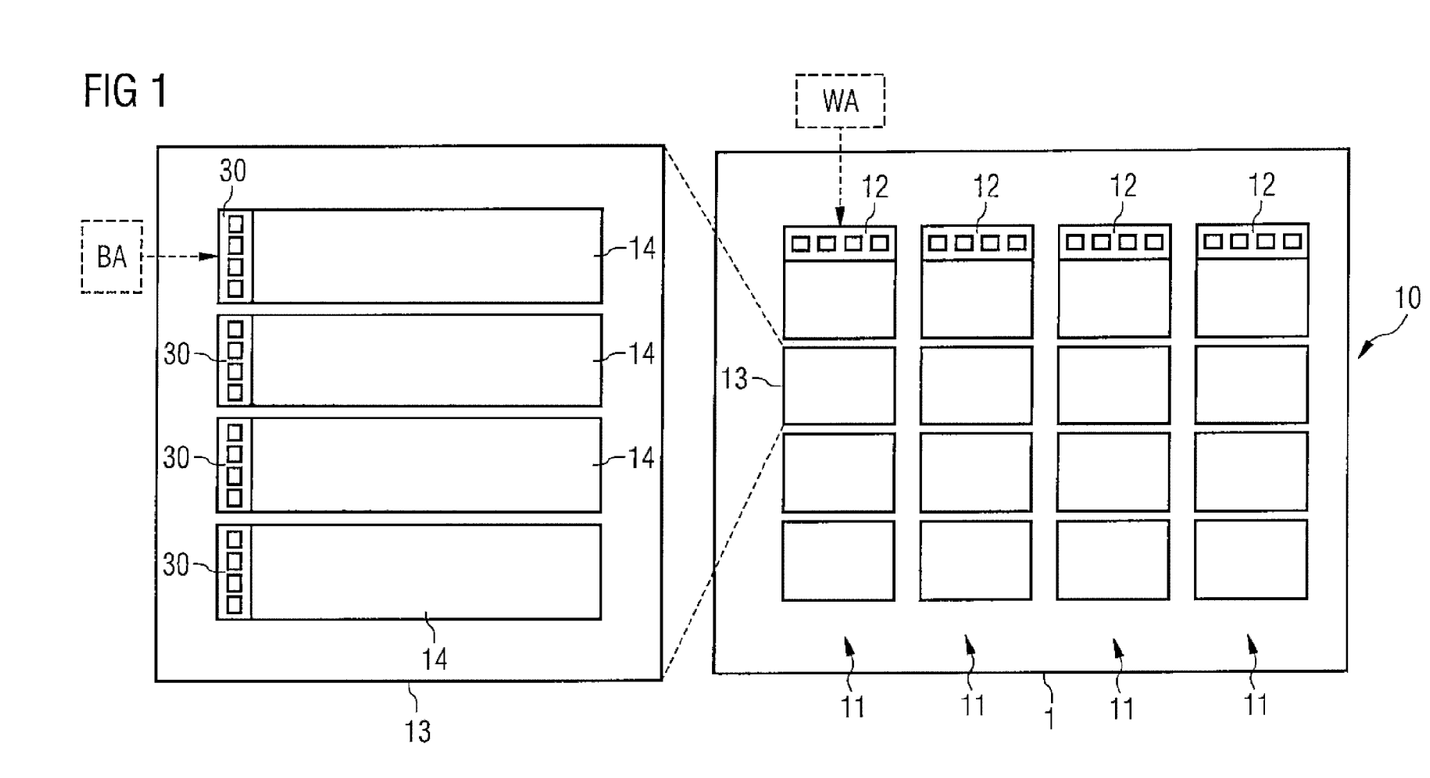
FIG. 1 shows a schematic illustration of a DRAM memory and also an enlarged illustration of a bank element of the DRAM.

FIG. 1 shows a schematic illustration of a DRAM memory 1 having a cell array 10 having memory cells (not shown) arranged in matrix-type fashion in rows and columns. The memory cells, which each have a storage capacitor and a memory transistor, can in this case be addressed via word lines and bit lines (not shown). The word lines are connected to activation apparatuses 12 arranged at the edge of the DRAM 1. Through application of a row address or word line address WA to one of the activation apparatuses 12 in the context of a memory access, a row or word line assigned to the row address WA is activated.

The cell array 10 is subdivided into four banks 11 which can be accessed simultaneously for a read or write operation. For this purpose, each bank 11 has an activation apparatus 12 for row activation.

Each bank 11 is furthermore subdivided into four bank elements 13. As becomes clear on the basis of the enlarged illustration of a bank element 13 of the DRAM 1, each bank element 13 has four so-called DRAM LDQ blocks 14 which are connected to a further activation apparatus 30 of the respective bank 11 for column activation. Through application of a column address or bit line address BA to an activation apparatus 30 in the context of a memory access, a column assigned to the column address BA is activated.

Figure 2:
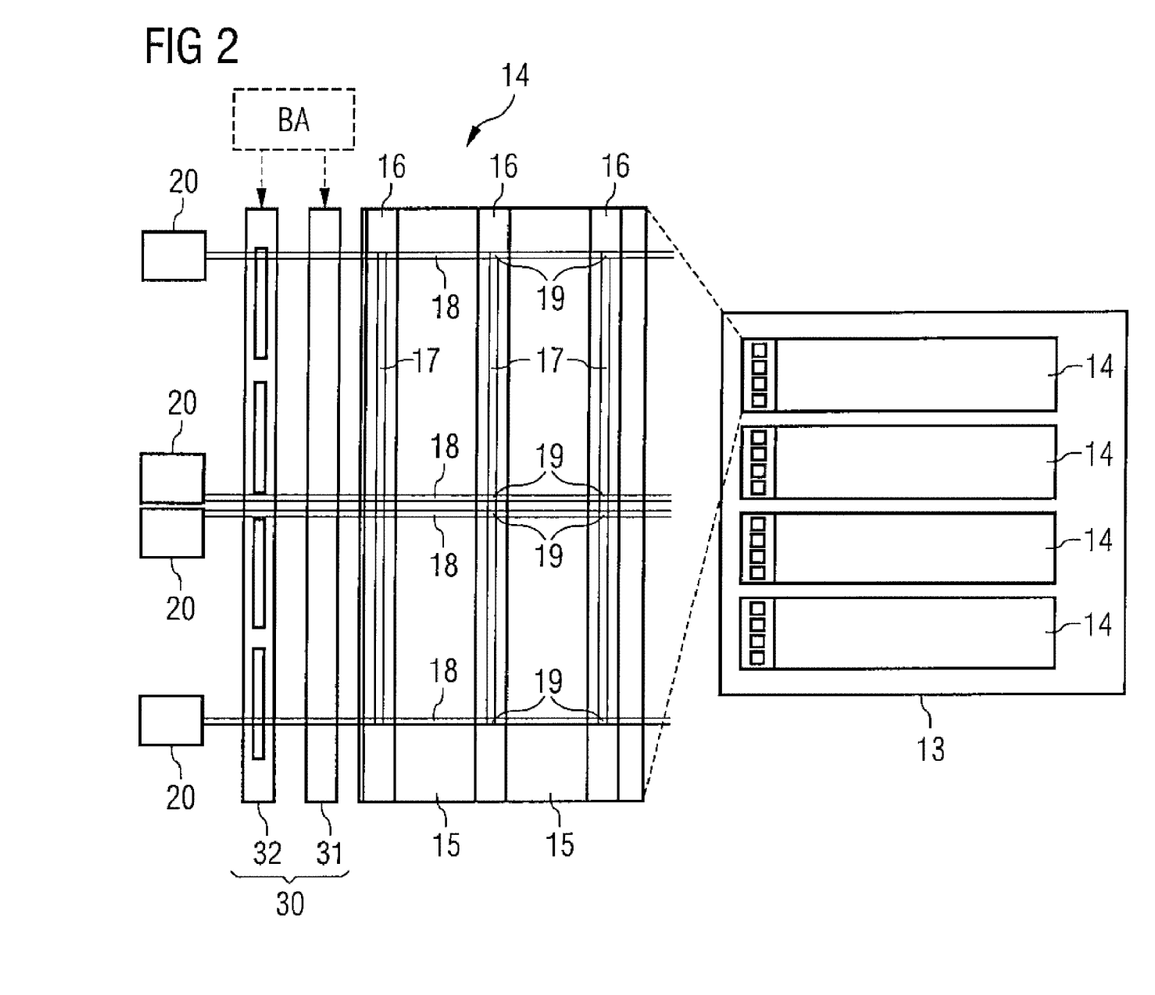
FIG. 2 shows an enlarged illustration of an excerpt from a DRAM LDQ block of the bank element from FIG. 1.
Figure 3:
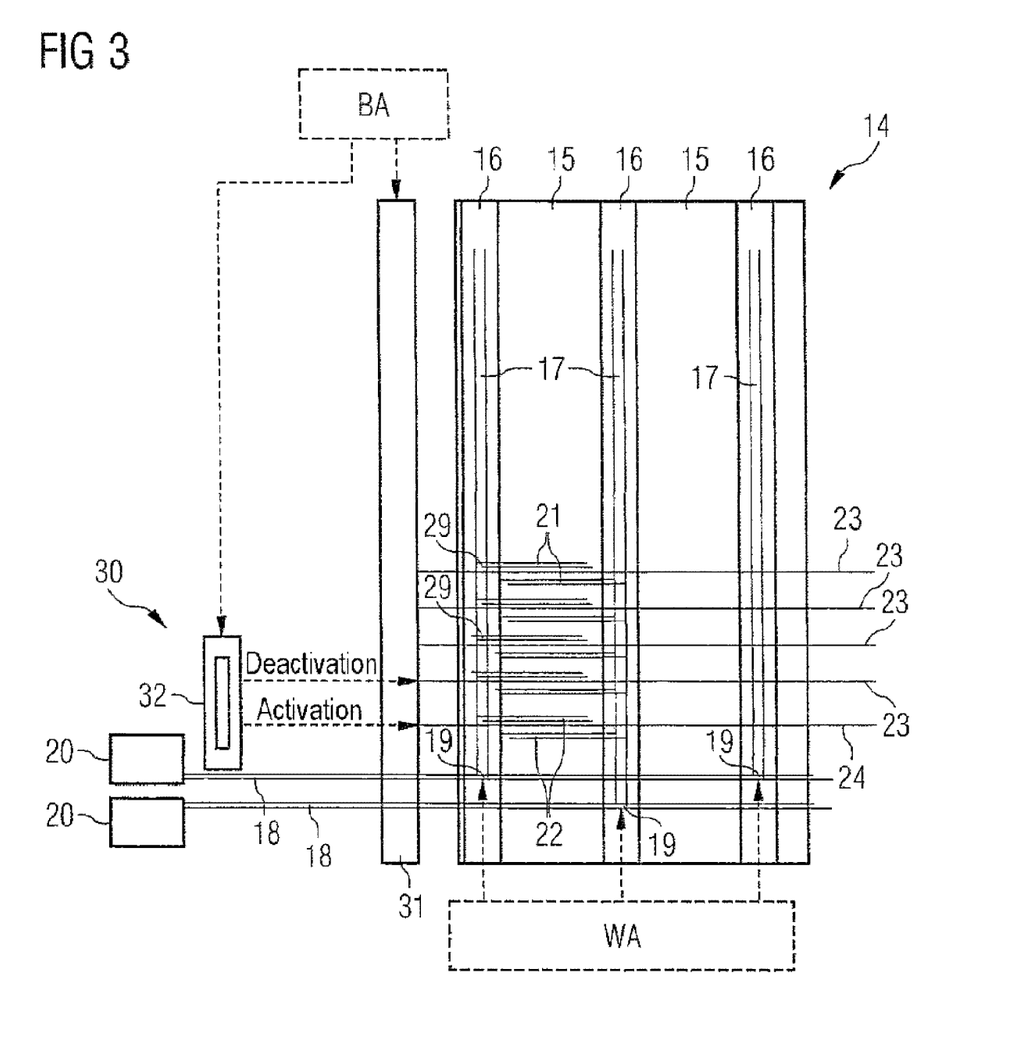
FIG. 3 shows a further enlarged illustration of an excerpt from the DRAM LDQ block for elucidating a conventional method for accessing the DRAM.

FIGS. 2 and 3 show an enlarged illustration of an excerpt from a DRAM LDQ block 14 of the bank element 13 from FIG. 1. The subdivision of a DRAM LDQ block 14 into so-called serial blocks 15 in which the memory cells are arranged becomes clear on the basis of this illustration. In this case, the serial blocks 15 extend over all the bank elements 13 of a bank 11. Furthermore, the construction of an activation apparatus 30 having a column decoder 31 and a fuse device 32 becomes clear on the basis of the enlarged illustration.

FIG. 3 furthermore illustrates bit lines which are organized in bit line pairs 21 and which are connected to primary sense amplifiers. In this case, the primary sense amplifiers are arranged in sense amplifier strips 16 at both sides of a serial block 15, wherein the primary sense amplifiers for bit line pairs 21 lying one below another in a serial block 15 in each case lie at opposite sides of the respective serial block 15, such that every second bit line pair 21 is connected to primary sense amplifiers on one side. For reasons of clarity, FIG. 3 illustrates bit line pairs 21 only of the serial block 15 arranged at the left-hand side of the DRAM LDQ block 14.

In order to read out the stored content of a memory cell, an associated bank 11 is addressed and a row address WA of the relevant row is applied to a corresponding activation apparatus 12 (see FIG. 1) in order to activate the row or word line. In this way, the storage capacitors of the memory cells of the relevant word line are connected to in each case one of the bit lines of a bit line pair 21, which gives rise in each case to a small charge difference on the bit lines of a bit line pair 21, which charge difference is amplified by an assigned sense amplifier in a sense amplifier strip 16. In this case, the polarity of the charge difference corresponds to the stored information of the memory cell.

The DRAM 1 furthermore has secondary sense amplifiers 20 assigned in each case to a group of primary sense amplifiers or bit line pairs 21 connected to the primary sense amplifiers. With the aid of the secondary sense amplifiers 20, which are connected to the data bus (not shown) of the DRAM 1 via corresponding data lines, the datum read out from the primary sense amplifiers is amplified and stored. For this purpose, the bit line pairs 21 can be connected to the associated secondary sense amplifiers 20 via read-out data line pairs 17, also referred to as LDQ lines (lower data quest), and master data line pairs 19, also referred to as MDQ lines (master data quest).

For this purpose—after the above-described activation of a corresponding row—a column address BA is applied to an activation apparatus 30 or to a column decoder 31 of an activation apparatus 30. Depending on the applied column address BA, a column select signal is generated by the column decoder 31 and is applied to an associated column select line 23, also referred to as a CSL line. The consequence of this is that a switching device 29 driven by the column select line 23 is closed and a bit line pair 21 assigned to the relevant column or column select line 23 in a serial block 15 is connected to a read-out data line pair 17 via the switching device 29, as a result of which the charge difference of the bit line pair 21 is present on the relevant read-out data line pair 17. The corresponding column is activated in this way.

In the exemplary embodiment illustrated in FIG. 3, in each case two bit line pairs 21 arranged one below another in a serial block 15 are assigned to a column select line 23. Consequently, two switching devices 29 arranged on both sides of a serial block 15 are activated by application of a column select signal to a column select line 23, with the result that the relevant bit line pairs 21 are connected to read-out data line pairs 17 arranged on both sides of the serial block 15.

The read-out data line pairs 17 are connected to the master data line pairs 18 via further switching devices 19. Via the master data line pairs 18, the secondary sense amplifiers 20 accept the data from the read-out data line pairs 17. The switching devices 19 are driven by means of a part of the row address WA which is referred to as serial block address and which specifies from which of the serial blocks 15 the data are to be read out.

In order to write to a memory cell of the DRAM 1, in a corresponding manner firstly a row containing the relevant memory cell is activated by application of the relevant row address WA to an activation apparatus 12 of a bank 11. Consequently, once again a respective potential difference is brought about between the bit lines of bit line pairs 21 connected to the enabled memory cells of the relevant row and is amplified by primary sense amplifiers. Once again the associated column is activated by subsequent application of the relevant column address BA to an activation apparatus 30 or a column decoder 31 of an activation apparatus 30, that is to say that a bit line pair 21 of a serial block 15 that is assigned to the relevant column or column select line 23 is connected to a read-out data line pair 17 via a switching device 29 as a result of the application of a column select signal to a corresponding column select line 23.

As a result of the driving of a switching device 19 by means of the corresponding serial block address, the relevant read-out data line pair 17 is connected to a master data line pair 18 and thus to a secondary sense amplifier 20. The selected memory cell is written to via the secondary sense amplifier 20 and the corresponding primary sense amplifier, an existing weaker signal of the memory cell being overwritten by the signal to be written. The amplified signal levels of the further bit line pairs 21 are not influenced by the write operation, but rather are only amplified by the primary sense amplifiers as in the read operation.

In order to replace defective memory cells or defective columns in the context of a memory access, the DRAM LDQ blocks 14 of the DRAM 1 have, as illustrated in FIG. 3, redundant memory cells with redundant bit line pairs 22 which can be connected to read-out data line pairs 17 via corresponding redundant column select lines 24 by the driving of switching devices 29. For reasons of clarity, FIG. 3 only illustrates two redundant bit line pairs 22 and one redundant column select line 24.

For the purpose of replacing a defective column in the context of a memory access, an activation apparatus 30 has a fuse device 32 alongside the column decoder 31. Error addresses of defective columns determined after a functional test of the DRAM 1 are stored in the fuse device 32, which comprises laser fuses, for example. A column address BA applied to the activation apparatus 30 is fed to the fuse device 32 as well as to the column decoder 31 in order to compare the applied column address BA with the error addresses. Conventionally, in the case of a match between the applied address and one of the error addresses, a corresponding deactivation signal is communicated to the column decoder 31 by the fuse device 32, with the result that the column select line 23 assigned to the defective column and thus the defective column are deactivated and a redundant column select line 24 for activating a redundant column is activated. After a redundant column has been accessed, the deactivation of a defective column is generally cancelled again.

Since the column address BA in the context of a memory access is also present at the column decoder 31, however, and an activation of a column that is instigated thereby can be carried out more rapidly via a corresponding column select line 23 than the comparison of the applied address with error addresses and subsequent deactivation of a column that has been identified as defective by deactivation of the corresponding column select line 23. As a result, there is the possibility in conventional memory access methods that both a defective column and a redundant column are activated, that is to say that both a defective bit line pair 21 or a bit line pair 21 connected to a defective memory cell and a redundant bit line pair 22 are connected to a common read-out data line pair 17 via switching devices 29. This gives rise to the risk, particularly during a read operation, that charge signals both from a defective column or from a defective bit line pair 21 and from a redundant column or a redundant bit line pair 22 will be applied to a common read-out data line pair 17 and thus communicated to a secondary sense amplifier 20, whereby the read-out result is corrupted.

In conventional memory access methods, therefore, an activation of a column by the column decoder 31 is delayed for a predetermined time duration starting from application of the corresponding address, in order to avoid an activation of a defective column. However, a procedure of this type is associated with increased access time for a memory access.

In order to avoid such a disadvantage, it is proposed in the manner according to the invention to deactivate all the defective columns on the basis of the error addresses stored in the fuse device 32 already prior to a first application of an address of a memory cell to an activation apparatus 30. Preferred embodiments of a method according to the invention are explained with reference to the subsequent FIGS. 4 and 5, which contain enlarged illustrations corresponding to FIG. 3 of an excerpt from a DRAM LDQ block 14.

Figure 4:
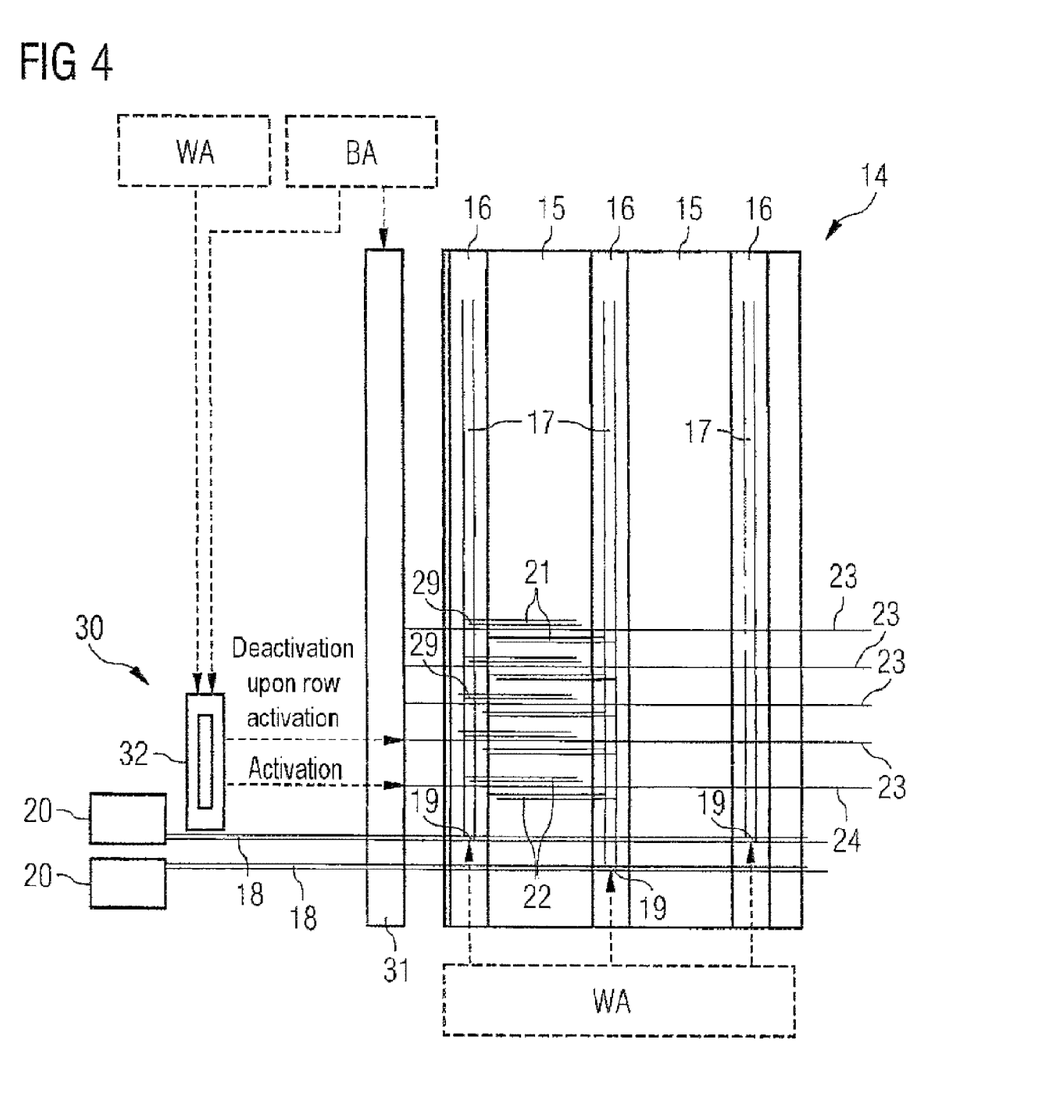
FIG. 4 shows an enlarged illustration corresponding to FIG. 3 of an excerpt from a DRAM LDQ block for elucidating one preferred embodiment of a method according to the invention for accessing the DRAM.

In the case of the DRAM LDQ block 14 illustrated in FIG. 4, a column select line 23 is in each case used to connect bit line pairs 21 of different serial blocks 15 to read-out data line pairs 17 in switchable fashion via corresponding switching devices 29. A column select signal applied via an individual column select line 23 is thus "distributed" over a plurality of serial blocks 15 arranged alongside one another, that is to say that individual columns of different serial blocks 15 that are arranged "alongside one another" can be activated by a common column select signal.

In such a case, according to one embodiment of the invention all the error addresses stored in the fuse device 32 are decoded upon the activation of a row or word line and defective columns or bit line pairs 21 are deactivated by deactivation of the corresponding assigned column select lines 23 with the aid of the activation apparatus 30. For this purpose, as illustrated in FIG. 4, the row address WA is fed to the fuse device 32 in order to ensure that a column select line 23 is deactivated only for the case where accessing a defective bit line pair 21 arranged in a specific serial block 15 is suppressed, whereas accessing an intact bit line pair 21 in another serial block 15 by means of the same column select line 23 still remains practicable. Instead of the row address WA, it is also possible for only a serial block address relating to the relevant serial block 15 to be fed to the fuse device 32. When a corresponding word line is reset after a redundant memory cell has been accessed, the deactivation of the defective columns is cancelled again.

Such a procedure makes it possible to activate a column directly after application of the corresponding address to a column decoder 31 without delaying the column access, as a result of which it is possible to carry out a memory access with a shorter access time. In this case, the method can be applied both to a read operation and to a write operation. During a column access, the fuse device 32 is furthermore fed the column address BA and also, since a column select signal is employed in a plurality of serial blocks 15 for driving switching devices 29, the word line address WA or the corresponding serial block address in order, in the case of a match with the error addresses stored in the fuse device 32, to activate a redundant column by applying a column select signal to a redundant column select line 24.

Figure 5:
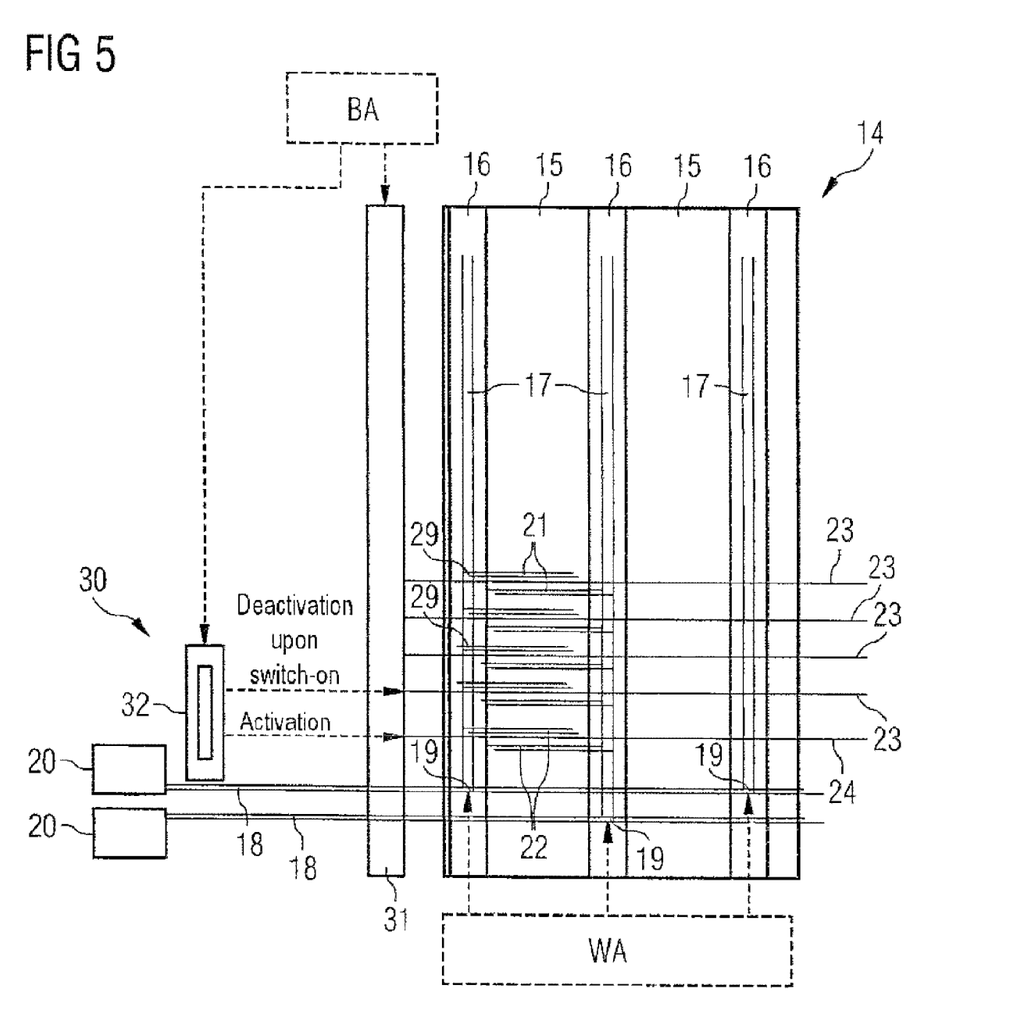
FIG. 5 shows a further enlarged illustration corresponding to FIG. 3 of an excerpt from a DRAM LDQ block for elucidating a further preferred embodiment of a method according to the invention.

In the case of the DRAM LDQ block 14 illustrated in FIG. 5, by contrast, individual column select lines 23 are only used for the switchable connection of bit line pairs 21 arranged in a respective serial block to read-out data line pairs 17. Consequently, a column select signal applied to an individual column select line 23 is not distributed between different serial blocks 15 for driving switching devices 29.

In such a case, the error addresses stored in the fuse device 32 can already be evaluated when the DRAM 1 is switched on, and all the defective columns or bit line pairs 21 can be deactivated by deactivation of the corresponding assigned column select lines 23 with the aid of the activation apparatus 30. The deactivation of the defective columns is preferably cancelled again only as a result of the switching off of the DRAM 1. In this way, too, a delay of the activation of a column is avoided, with the result that a column can be activated directly after application of the corresponding address to a column decoder 31, which results in a fast access time during a memory access. This method, too, can be applied both to a read operation and to a write operation.

During a column access, the fuse device 32 is furthermore fed the corresponding column address BA in order, in the case of a match with the error addresses stored in the fuse device 32, to activate a redundant column by applying a column select signal to a redundant column select line 24. Since the redundant column select lines 24, too, are only provided for driving bit line pairs 21 in individual serial blocks 15, in this case no row address is applied to the fuse device 32.

The embodiments of a method according to the invention as explained with reference to FIGS. 4 and 5 are not restricted to a DRAM memory having the structure illustrated in the figures. The method according to the invention can be used in a corresponding manner for replacing defective cell array elements by redundant cell array elements in memories having a different construction.

Additionally, further embodiments of a method according to the invention exist in which replacement of defective rows or word lines by redundant rows or word lines is carried out alongside or instead of replacement of defective columns by redundant columns. For this purpose, activation apparatuses of a memory that are provided for row activation, like for example the activation apparatuses 12 illustrated in FIG. 1, have row decoders and fuse devices (not shown) in a manner corresponding to the activation apparatuses 30, error addresses of defective rows being stored in the fuse devices.

In the manner according to the invention, a defective row or all defective rows is or are in this case deactivated prior to an addressing of the relevant row(s) by decoding of the error addresses stored in the fuse devices. Preferably, defective rows are already deactivated when the DRAM is switched on. A redundant row is activated in a corresponding manner by applying a row address to an activation apparatus 12 or to a fuse device of an activation apparatus 12 and ascertaining a match between the applied address and the error addresses stored in the fuse device.

Further, embodiments of a method according to the invention are contemplated in which, instead of individual columns or rows, a number of a plurality of columns or rows are jointly replaced by a corresponding number of redundant columns or rows.

While the foregoing is directed to embodiments of the present invention, other and further embodiments of the invention may be devised without departing from the basic scope thereof, and the scope thereof is determined by the claims that follow.

What is claimed is:

1. A method for accessing a memory comprising a cell array having a plurality of memory cells arranged in cell array elements, the method comprising:
    deactivating a cell array element;
    applying an address of the deactivated cell array element to an activation apparatus of the memory in order to activate the deactivated cell array element for a memory access in which a memory cell arranged in a cell array element is to be accessed;
    comparing the applied address with error addresses which are stored in the activation apparatus and which are assigned to defective cell array elements of the cell array; and
    in response to a match between the applied address and one of the error addresses, activating a redundant cell array element of the cell array instead of the deactivated cell array element; wherein activating the redundant cell array element comprises issuing a signal from the activation apparatus.

2. The method as claimed in claim 1, wherein all of the defective cell array elements of the cell array are deactivated prior to a first application of an address associated with any of the cell array elements to the activation apparatus.

3. The method as claimed in claim 1, wherein the cell array comprises rows and columns in which the memory cells are arranged, and wherein the deactivated cell array element is a column of the cell array of the memory.

4. The method as claimed in claim 3, wherein the memory access comprises activating a respective row containing the memory cell to be accessed, and wherein deactivating the cell array element is done when the respective row is activated.

5. The method as claimed in claim 3, wherein deactivating the cell array element is done when the memory is switched on.

6. The method as claimed in claim 1, wherein the cell array comprises rows and columns in which the memory cells are arranged, and wherein the defective cell array element is a row of the cell array of the memory.

7. The method as claimed in claim 6, deactivating the cell array element is done when the memory is switched on.

8. The method as claimed in claim 6, wherein all of the defective cell array elements of the cell array are deactivated prior to a first application of an address associated with any of the cell array elements to the activation apparatus.

9. The method as claimed in claim 1, wherein all of the defective cell array elements of the cell array are deactivated prior to a first application of an address associated with any of the cell array elements to the activation apparatus; wherein the cell array comprises rows and columns in which the memory cells are arranged, and wherein the deactivated cell array element is a column of the cell array of the memory.

10. A device, comprising:
    a cell array having a plurality of memory cells arranged in cell array elements;
    a storage area containing error addresses assigned to defective cell array elements of the cell array; and
    an activation apparatus configured to:
        deactivate a cell array element;
        as part of a memory access operation, receive an address of the deactivated cell array element;
        compare the received address with the error addresses; and
        in response to determining a match between the received address and one of the error addresses, activating a redundant cell array element of the cell array instead of the deactivated cell array element.

11. The device of claim 10, wherein the cell array is part of a dynamic random access memory device.

12. A memory device, comprising a cell array having a number of memory cells arranged in cell array elements, comprising an activation apparatus for activating a cell array element for a memory access, wherein, when a memory cell arranged in a cell array element of the memory is accessed, an address of the relevant cell array element is applied to the activation apparatus in order to activate the relevant cell array element for the memory access, wherein the applied address is compared with error addresses which are stored in the activation apparatus and which are assigned to defective cell array elements, wherein, in the event of a match between the applied address and one of the error addresses, a redundant cell array element is activated instead of the relevant defective cell array element with the aid of the activation apparatus, wherein the memory is designed to deactivate the relevant defective cell array element prior to the application of the address associated with the relevant cell array element to the activation apparatus.

* * * * *